(12) United States Patent
Nakamura et al.

(10) Patent No.: US 12,027,822 B2
(45) Date of Patent: Jul. 2, 2024

(54) OPTICAL SEMICONDUCTOR DEVICE

(71) Applicant: Lumentum Japan, Inc.

(72) Inventors: Atsushi Nakamura, Nagano (JP);
Hayato Takita, Kanagawa (JP);
Shigetaka Hamada, Kanagawa (JP);
Ryosuke Nakajima, Sagamihara (JP);
Masatoshi Arasawa, Shinagawa-ku
(JP); Ryu Washino, Kanagawa (JP)

(73) Assignee: Lumentum Japan, Inc., Kanagawa (JP)

( * ) Notice: Subject to any disclaimer, the term of this patent is extended or adjusted under 35 U.S.C. 154(b) by 200 days.

(21) Appl. No.: 17/304,526

(22) Filed: Jun. 22, 2021

(65) Prior Publication Data
US 2022/0166193 A1 May 26, 2022

(30) Foreign Application Priority Data

Nov. 25, 2020 (JP) .................................. 2020-194960
Feb. 5, 2021 (JP) .................................. 2021-017749

(51) Int. Cl.
*H01S 5/22* (2006.01)
*H01S 5/026* (2006.01)
(Continued)

(52) U.S. Cl.
CPC .......... *H01S 5/2218* (2013.01); *H01S 5/0265* (2013.01); *H01S 5/12* (2013.01);
(Continued)

(58) Field of Classification Search
CPC ................ H01S 5/227–2277; H01S 5/2224
See application file for complete search history.

(56) References Cited

U.S. PATENT DOCUMENTS

2007/0045633 A1* 3/2007 Takiguchi ............. B82Y 20/00
257/79
2015/0063391 A1* 3/2015 Takeuchi ............. H01S 5/2205
372/45.01
(Continued)

FOREIGN PATENT DOCUMENTS

JP 2010-267674 A 11/2010
JP 2012-002929 A 1/2012
WO 2019220514 A1 11/2019

*Primary Examiner* — Michael Carter
*Assistant Examiner* — Stephen Sutton Kotter
(74) *Attorney, Agent, or Firm* — Harrity & Harrity, LLP

(57) ABSTRACT

To provide an optical semiconductor device having excellent long-term reliability, the optical semiconductor device includes: a substrate; a mesa structure provided on the substrate; a semiconductor burial layer provided in contact with two sides of the mesa structure; and an electrode containing Au, which is provided above the semiconductor burial layer. The mesa structure includes a first conductivity type semiconductor layer, a multiple-quantum well layer, and a second conductivity type semiconductor layer, which are stacked in the stated order from a substrate side. The semiconductor burial layer includes a first semi-insulating InP layer provided in contact with side portions of the mesa structure, a first anti-diffusion layer provided in contact with the first semi-insulating InP layer, and a second semi-insulating InP layer provided on the first anti-diffusion layer. The first anti-diffusion layer has an Au diffusion constant that is smaller than that of the first semi-insulating InP layer.

10 Claims, 11 Drawing Sheets

(51) Int. Cl.
  *H01S 5/12*  (2021.01)
  *H01S 5/227*  (2006.01)
  *H01S 5/34*  (2006.01)

(52) U.S. Cl.
  CPC ............ *H01S 5/2206* (2013.01); *H01S 5/227* (2013.01); *H01S 5/34* (2013.01)

(56) References Cited

U.S. PATENT DOCUMENTS

2016/0126701 A1* 5/2016 Okuda .................. H01S 5/2272
  438/45
2017/0373473 A1* 12/2017 Bismuto ............... H01S 5/2206

* cited by examiner

OPTICAL SEMICONDUCTOR DEVICE

CROSS REFERENCE TO RELATED APPLICATION

The present application claims priority from Japanese patent application JP 2021-017749 filed on Feb. 5, 2021, which claims priority from Japanese Application No. JP 2020-194960 filed on Nov. 25, 2020, the contents of which are hereby expressly incorporated by reference herein.

TECHNICAL FIELD

The present invention relates to an optical semiconductor device.

BACKGROUND

Recently, with the spread of mobile terminals, and the Internet and other communication devices, optical transceivers are required provide increased speed and capacity. In many cases, optical semiconductor devices are used as light sources of the optical transceivers. An optical semiconductor device can include a buried hetero-structure (BH structure), in which both side surfaces of a mesa structure that includes a multiple quantum well layer are buried in a semiconductor layer. Such a semiconductor device typically has high reliability, high high-speed responsivity, and low parasitic capacitance. The semiconductor layer, in which the side surfaces of the mesa structure are buried, is formed by a plurality of semiconductor layers, including a semi-insulating semiconductor layer and a PN junction. In some cases, a light source can include a direct-modulation semiconductor laser and an electro-absorption modulator (EA modulator) configured to modulate continuous light emitted from a semiconductor laser.

In some cases an EA modulator can have a BH structure. For example, both sides of a mesa-stripe structure can be buried in a Ru-doped InP layer (e.g., a burial layer). The mesa-stripe structure can be formed of an n-type InGaAsP lower guide layer, a multiple-quantum well (MQW) layer, a p-type InGaAsP upper guide layer, a p-type InP cladding layer, and a p-type contact layer. A p-type electrode comprising Ti, Pt, and/or Au can be connected to the p-type contact layer. On a back side of a substrate (e.g., of a wafer), an n-type electrode comprising AuGe, Ni, Ti, Pt, and/or/Au is formed. Through application of a voltage between the p-type electrode and the n-type electrode, the EA modulator absorbs light to operate as a modulator. The p-type electrode can also be formed on the burial layer with interposition of a passivation film. An oscillator (e.g., a distributed feedback (DFB) laser) can also have a substantially similar structure. Further, some manufacturing processes suppress abnormal growth of the burial layer.

In some cases, a cladding layer and a contact layer are can be formed on a BH structure to form a planer BH (PBH) structure. In the PBH structure, a burial layer is arranged on both sides of a mesa shape, and a p-InP cladding layer is arranged across the entire burial layer including the top of the mesa shape. Further, a p-type InGaAs contact layer can cover the p-InP cladding layer.

In some cases, in an optical semiconductor device, Au is used as an electrode material, which has high diffusion rate for InP. When Au diffusion progresses and reaches an active layer (e.g., a multiple-quantum well layer), characteristics and reliability of the optical semiconductor device degrade. In the optical semiconductor device having a BH structure formed on an InP substrate, for example, semi-insulating InP (SI-InP) obtained by doping InP with Fe can be used as a buried material. Immediately after buried growth, the burial layer can be exposed on a surface of the optical semiconductor device except immediately above the mesa structure, and hence an outermost surface of optical semiconductor device can be an Fe—InP layer. In some cases, the p-type electrode has structure in which Ti, Pt, and/or Au are stacked from a semiconductor layer side. Pt can suppress diffusion of Au into the semiconductor layer, but it is difficult to completely prevent the diffusion of Au due to the effect of a surface shape of the semiconductor layer. Consequently, Au contained in the p-type electrode can diffuse into the multiple-quantum well layer through the burial layer made of InP. Further, in some cases, the p-type InGaAs contact layer can be arranged between an upper surface electrode and the p-type InP cladding layer. An InGaAs layer has a smaller Au diffusion coefficient as compared to InP, and therefore a likelihood that Au can diffuse into the p-type InP cladding layer is small. However, there exists a possibility that Au diffuses because the InGaAs contact layer is formed thin (e.g., due to a manufacturing variation). When Au diffuses, it can diffuse into the active layer from side surface sides of the active layer through the p-type InP cladding layer and the buried InP layer.

SUMMARY OF THE INVENTION

In some implementations, an optical semiconductor device includes: a substrate; a mesa structure disposed on the substrate; a semiconductor burial layer provided in contact with two sides of the mesa structure; and an electrode containing Au, which is provided above the semiconductor burial layer. The mesa structure includes a first conductivity type semiconductor layer, a multiple-quantum well layer, and a second conductivity type semiconductor layer, which are stacked in the stated order from the substrate side. The semiconductor burial layer includes a first semi-insulating InP layer provided in contact with side portions of the mesa structure, a first anti-diffusion layer provided in contact with the first semi-insulating InP layer, and a second semi-insulating InP layer provided on the first anti-diffusion layer. The first anti-diffusion layer has an Au diffusion constant that is smaller than an Au diffusion constant of the first semi-insulating InP layer.

In some implementations, the optical semiconductor device provides excellent long-term reliability.

DETAILED DESCRIPTION

Figure 1:
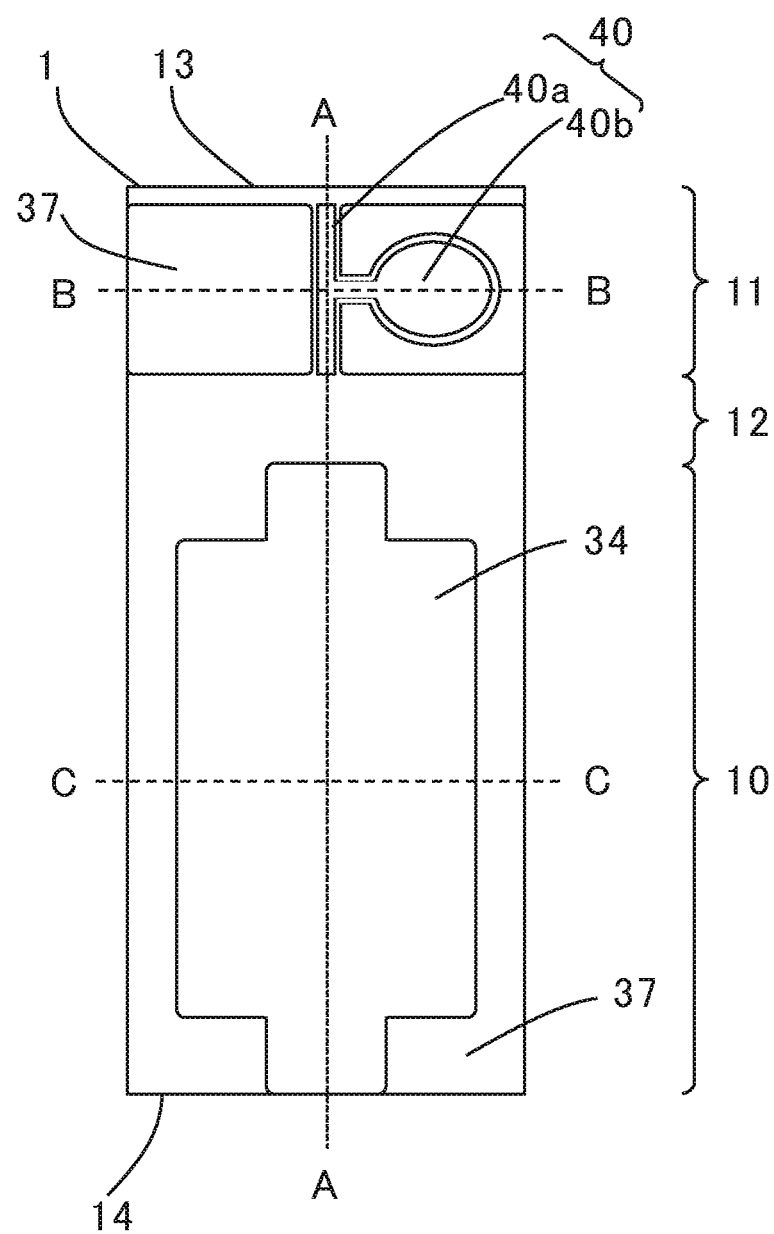
FIG. 1 is a top view of an example optical semiconductor device described herein.

Some implementations are specifically described in detail in the following with reference to the attached drawings. Note that, throughout the figures for illustrating the implementations, like reference numerals are used to represent members having like functions, and description thereof is omitted for the sake of simplicity. Note that, the drawings referred to in the following are only for illustrating the implementations by way of examples, and are not necessarily drawn to scale.

FIG. 1 is a top view of an example optical semiconductor device 1. The optical semiconductor device 1 may be a modulator-integrated semiconductor laser in which a semiconductor laser 10 and an electro-absorption modulator (EA modulator) 11 are integrated. While an integrated example is described herein, implementations include just the semiconductor laser or just the EA modulator. The optical semiconductor device 1 may be an integrated device in which the semiconductor laser 10, a waveguide 12, and the EA modulator 11 are optically connected to one another (e.g., in the stated order). The semiconductor laser 10 may be configured to emit continuous light, and the waveguide 12 may be configured to transmit the emitted light from the semiconductor laser 10 to the EA modulator 11. The EA modulator 11 may include a multiple-quantum well layer that absorbs light corresponding to an oscillation wavelength of the semiconductor laser 10. The continuous light that has passed through the waveguide 12 and has entered the EA modulator 11 may be modulated in intensity by the EA modulator 11 to be converted into a modulated optical signal that may be binary or 4-level, for example. The modulated optical signal may output from the EA modulator 11 from a front end face 13. Another structure, for example, a window structure in which insulating InP may be arranged, may be provided near the front end face 13. On the front end face 13, a dielectric non-reflective film (not shown) may be formed. Further, on a back end face 14, which may be an end face on an opposite side of the semiconductor laser 10, a dielectric high-reflective film (not shown) may be formed. Further, although details are described later, a mesa structure may be provided from the semiconductor laser 10 to the EA modulator 11, and two sides of the mesa structure may be buried in a semiconductor burial layer to form a buried semiconductor device.

Figure 2:
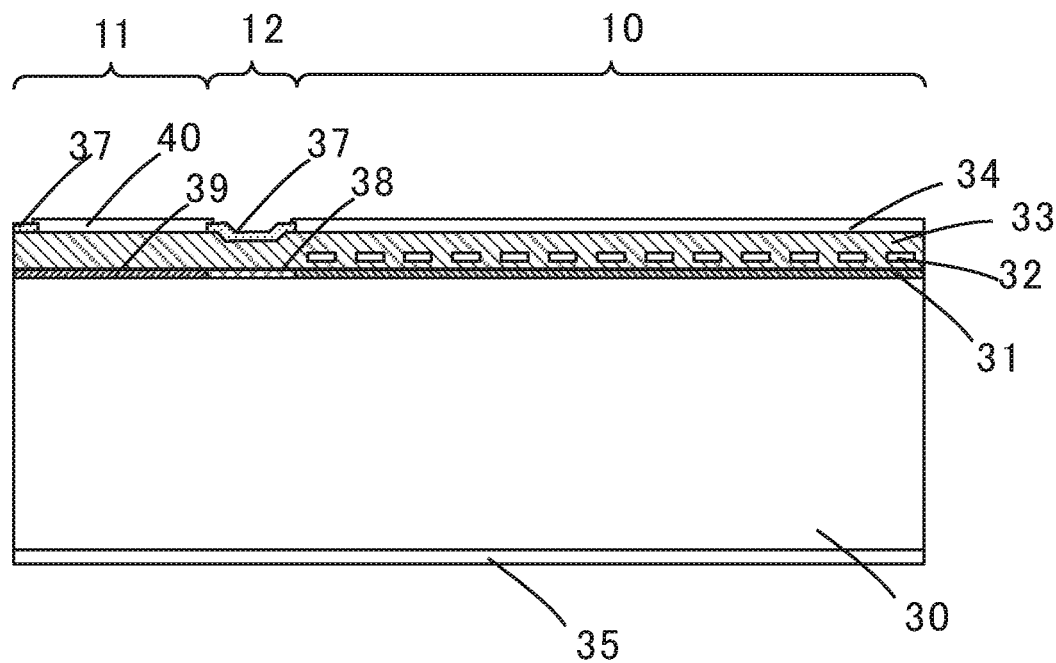
FIG. 2 is a cross-sectional view taken along the line A-A of the optical semiconductor device illustrated in FIG. 1.

FIG. 2 is a schematic view of a cross section taken along the line A-A, which may be parallel to an optical axis of the optical semiconductor device 1. On an n-InP substrate 30 (substrate) serving as a base, the semiconductor laser 10, the waveguide 12, and the EA modulator 11 may be integrated. Here, the n-InP substrate 30 serves also as a first conductivity type semiconductor layer. The semiconductor laser 10 may be, for example, a distributed feedback (DFB) laser configured to oscillate in a 1.3-μm band, a 1.55-μm band, or another band. Further, the semiconductor laser 10 may be a Fabry-Perot (FP) laser, a distributed Bragg reflector (DBR) laser, or a distributed reflector (DR) laser, among other examples. The semiconductor laser 10 may include a laser-section multiple-quantum well layer 31, and a grating layer 32 provided above the laser-section multiple-quantum well layer 31. Between and on gratings of the grating layer 32, a p-InP cladding layer 33 (e.g., a second conductivity type semiconductor layer) may be provided. Although not shown, optical confinement layers may be provided on and below the laser-section multiple-quantum well layer 31, respectively. Further, on the top of the p-InP cladding layer 33, a contact layer 42 (further described herein in relation to FIG. 4B) may be provided. The contact layer 42 may be electrically and physically connected to a laser-section electrode 34 (e.g., a second conductivity-side electrode). On a back side of the n-InP substrate 30, a back-side electrode 35 (e.g., a first conductivity-side electrode) may be provided to cover substantially the entire surface of the n-InP substrate 30. The semiconductor laser 10 may be configured to emit the continuous light when an electric field is applied (electric current is input) between the laser-section electrode 34 and the back-side electrode 35. Here, a composition wavelength and the like of the laser-section multiple-quantum well layer 31, and a grating constant of the grating layer 32 may be set to oscillate in the 1.3-μm band.

The EA modulator 11 may include a modulator-section multiple-quantum well layer 39. Although not shown, optical confinement layers may be provided on and below the modulator-section multiple-quantum well layer 39, respectively. The modulator-section multiple-quantum well layer 39 may have a structure for absorbing light emitted from the semiconductor laser 10 when an electric field is applied to the modulator-section multiple-quantum well layer 39. Above the modulator-section multiple-quantum well layer 39, a p-InP cladding layer 33 may be arranged. Here, the same p-InP cladding layer 33 as that provided in the semiconductor laser 10 may be formed, or a different p-InP cladding layer 33 may be formed. Above the p-InP cladding layer 33, a modulator electrode 40 (e.g., a second conductivity-side electrode) may be arranged. The modulator electrode 40 may be electrically and physically connected to a contact layer 42 arranged above the p-InP cladding layer 33. The contact layer 42 may be the same contact layer as that provided in the semiconductor laser 10, but may be a different contact layer 42. Light may be absorbed when a reverse bias is applied between the modulator electrode 40 and the back-side electrode 35. The modulator electrode 40 may be formed of a substantially rectangular modulator mesa electrode 40a provided above the mesa structure, and an elliptical modulator pad electrode 40b. The modulator mesa electrode 40a and the modulator pad electrode 40b may be connected to each other through a thin extraction electrode. Further, the modulator electrode 40 may be divided into a plurality of parts for convenience of description, but the parts may be integral with a same structure. Further, the shape of the modulator pad electrode 40b may be not limited to the elliptical shape, but may be a rectangular shape, a rounded rectangular shape, or a circular shape. A signal wire (not shown) for transmitting an electrical signal to the EA modulator 11 may be connected to the modulator pad electrode 40b.

The waveguide 12 may include a waveguide-section semiconductor layer 38. The waveguide-section semiconductor layer 38 may be a semiconductor layer that does not absorb the light emitted from the semiconductor laser 10, and may be a bulk layer, for example. Further, optical confinement layers may be provided on and below the waveguide-section semiconductor layer 38, respectively. Above the waveguide-section semiconductor layer 38, a p-InP cladding layer 33 may be arranged. Here, the same p-InP cladding layer 33 as that provided in the semiconductor laser 10 may be formed, or a different p-InP cladding layer 33 may be formed. The p-InP cladding layer 33 of the waveguide 12 may have the same configuration as that provided in the semiconductor laser 10, but may have a different thickness. The p-InP cladding layer 33 of the waveguide 12 may be thinner as compared to the p-InP cladding layer 33 of the semiconductor laser 10. This increase electrical isolation between the EA modulator 11 and the semiconductor laser 10.

Figure 3A:
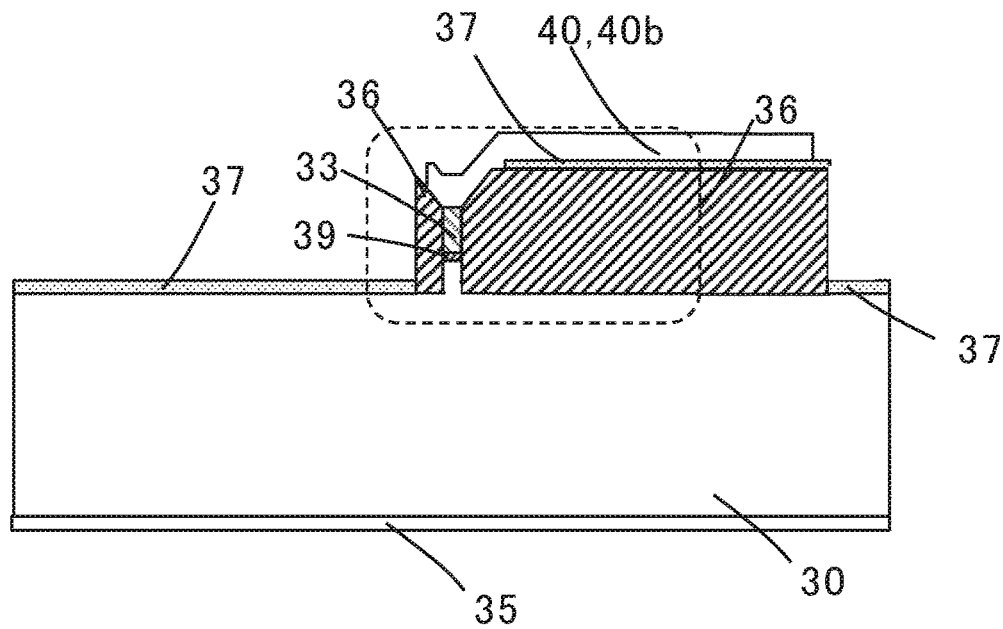
FIG. 3A is a cross-sectional view taken along the line B-B of the optical semiconductor device illustrated in FIG. 1.

FIG. 3A is a schematic view of a cross section taken along the line B-B, which may be perpendicular to an optical axis of the EA modulator 11. The mesa structure may be formed of a portion of the n-InP substrate 30, the modulator-section multiple-quantum well layer 39, the p-InP cladding layer 33, and the contact layer 42 (shown in FIG. 3B). Two sides of the mesa structure may be buried in a burial layer (BH layer) 36. From a portion above the mesa structure to a portion above the BH layer on one side, the modulator electrode 40 may be arranged. The modulator electrode 40 may have a three-layer structure of Ti, Pt, and Au from the BH layer 36 side. Ti may be provided to increase a bonding strength between another metal and a semiconductor, and may be another metal with a similar property. Pt may have a function of a barrier layer configured to prevent Au from diffusing to the semiconductor layer side, and may be another metal with a similar property. For example, Pd may be arranged instead of Pt. In some implementations, even with the Pt layer, Au may diffuse to the semiconductor layer side (e.g., from a gap thereof). Accordingly, above the BH layer 36, an insulating film (e.g., a passivation film) 37 may be arranged between the modulator electrode 40 and the BH layer 36. The insulating film 37 may be a $SiO_2$ film, but other films may be used. Another oxide film may be provided between the insulating film 37 and the modulator pad electrode 40b. On a back surface of the n-InP substrate 30, the back-side electrode 35 may be formed. The BH layer 36 may be formed only in portions on both sides of the mesa structure and below the modulator electrode 40, and a region in which the BH layer 36 is not formed may provide a structure in which the insulating film 37 may be formed on the n-InP substrate 30.

Figure 3B:
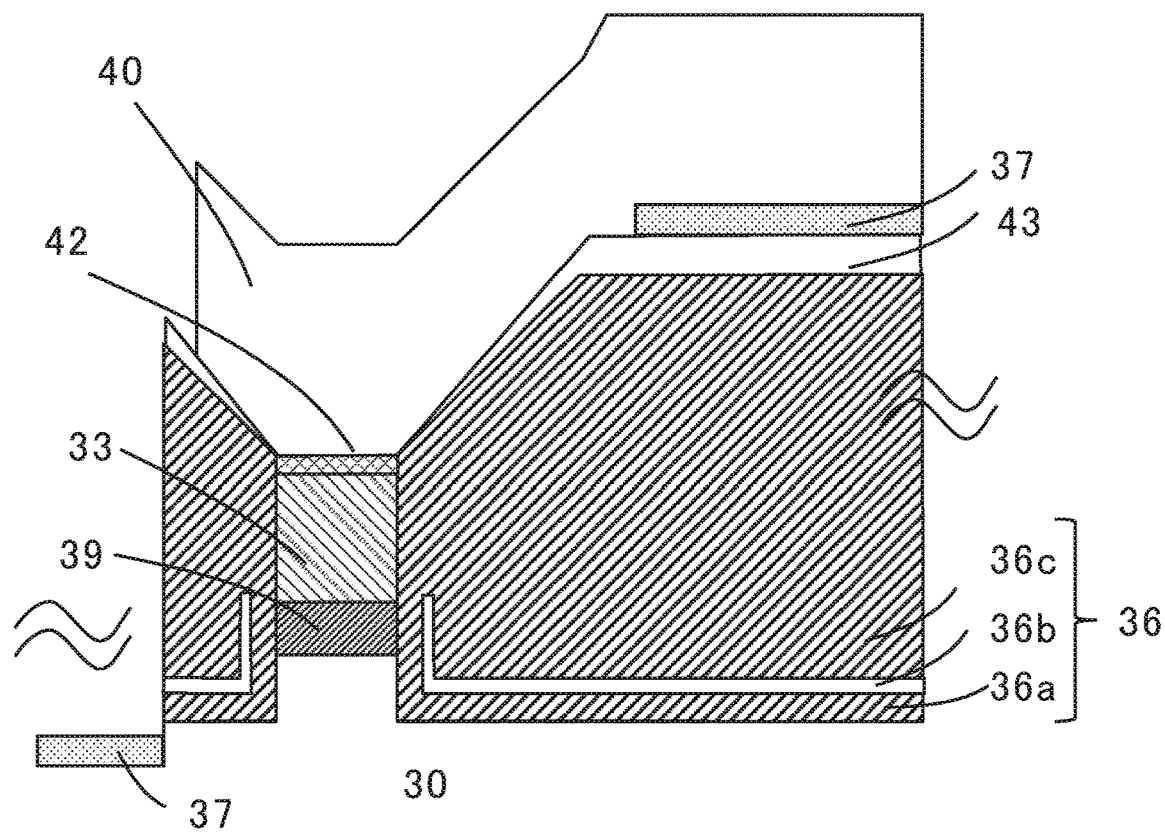
FIG. 3B is a partially enlarged view of FIG. 3A.

FIG. 3B is an enlarged view of a region delineated by the dotted rectangle of FIG. 3A. Although not shown in FIG. 3A, the BH layer 36 of the semiconductor device 1 may have a three-layer configuration of a first semi-insulating InP layer 36a, a first anti-diffusion layer 36b, and a second semi-insulating InP layer 36c. The second semi-insulating InP layer 36c may be a layer that is thicker than the first semi-insulating InP layer 36a. The BH layer 36 may include inclined surface portions in left and right directions in the drawing from the top of the mesa structure. In other words, the BH layer 36 may have inclined surface portions that become higher in height, measured from a surface of the n-InP substrate 30, as the BH layer 36 moves farther away from the mesa structure. On one side (a left side of FIG. 3B) of the mesa structure, the BH layer 36 may be formed up to a midway of the inclined surface portion. On the opposite side (a right side of FIG. 3B), there may be a horizontal region on the right side of the inclined surface portion. The first semi-insulating InP layer 36a and the second semi-insulating InP layer 36c may be Fe-doped semi-insulating InP layers, Ru-doped semi-insulating InP layers, or other doped InP layers. The first semi-insulating InP layer 36a and the second semi-insulating InP layer 36c may be integrated in a region in which the first semi-insulating InP layer 36a and the second semi-insulating InP layer 36c contact each other, but are formed as different layers in a manufacturing step. On an upper surface of the second semi-insulating InP layer 36c, a second anti-diffusion layer 43 may be arranged. The second anti-diffusion layer 43 may be mainly arranged in the horizontal region of the second semi-insulating InP layer 36c, but may be formed to be thinner as compared to that in the horizontal region so as to cover the inclined surface portions. In some implementations, the second anti-diffusion layer 43 may not be formed on the inclined surface portions. The first anti-diffusion layer 36b and the second anti-diffusion layer 43 may comprise undoped InGaAs. InGaAs has a sufficiently small Au diffusion constant as compared to that of InP. In some implementations, the first anti-diffusion layer 36b and the second anti-diffusion layer 43 may be any one of p-type, n-type, and semi-insulating semiconductors. Further, when the first anti-diffusion layer 36b and the second anti-diffusion layer 43 have respective Au diffusion constants that are smaller than that of InP, the first anti-diffusion layer 36b and the second anti-diffusion layer 43 may be made of another material, such as InGaAsP, InGaAlAs, or InAlAs.

The first anti-diffusion layer 36b may be formed of a region that may be substantially parallel to the n-InP substrate 30, and a region that may be substantially parallel to a stacking direction of the mesa structure. Here, for simplicity of description, a bending region may be illustrated as being right-angled, but may bend with a curve in some implementations. Further, in the region that may be substantially parallel to the stacking direction of the mesa structure, the first anti-diffusion layer 36b may be parallel to side surfaces of the mesa structure in the drawing, but the first anti-diffusion layer 36b may be formed at a certain angle with respect to the side surfaces of the mesa structure. In other words, the first anti-diffusion layer 36b in the region that may be substantially parallel to the stacking direction of the mesa structure may be formed so that a distance from the side surfaces of the mesa structure becomes longer as the first anti-diffusion layer 36b becomes closer to the substrate. Further, the region that may be substantially parallel to the stacking direction of the mesa structure may have a thickness that may be thinner than a thickness of the region that may be substantially parallel to the n-InP substrate 30. A tip of the region that may be substantially parallel to the stacking direction of the mesa structure may not reach the top of the mesa structure, but may reach up to a midway point of the p-InP cladding layer 33.

As described above, Au contained in an electrode may diffuse into InP. In some implementations, there may be a region in which the insulating film 37 may be not interposed between the electrode and the burial layer comprising InP. In some implementations, the region may be a portion of a region that may be horizontal to the inclined surface portions of the burial layer. When the electrode contacts InP through this region, Au can pass through the buried InP layer and diffuse into the modulator-section multiple-quantum well layer 39 and a crystal crack can be generated, for example, and characteristics and reliability are reduced. However, in some implementations, the BH layer 36 includes the first anti-diffusion layer 36b. The first anti-diffusion layer 36b may be made of InGaAs, and may have a property that it is more difficult to diffuse Au as compared to InP. Au that diffuses into the second semi-insulating InP layer 36c may be trapped by the first anti-diffusion layer 36b and may not reach the modulator-section multiple-quantum well layer 39, and thereby the characteristics and long-term reliability can be ensured. The first anti-diffusion layer 36b may not completely partition the first semi-insulating InP layer 36a and the second semi-insulating InP layer 36c, and hence Au still may diffuse into the modulator-section multiple-quantum well layer 39 through a gap. However, a diffusion amount of Au can be significantly reduced by the first anti-diffusion layer 36b, and sufficient reliability that can endure practical use may be obtained. It may be desired that tips of the first anti-diffusion layer 36b be formed to a height at least exceeding the modulator-section multiple-quantum well layer 39.

In some implementations, as viewed in a lateral direction of FIG. 3B, the first anti-diffusion layer 36b be separated from the modulator-section multiple-quantum well layer 39 by a distance of 10 nm or more. When the first anti-diffusion layer 36b and the mesa portion are electrically connected to each other, the capacitance may increase, and high-frequency characteristics may be reduced. Additionally, or alternatively, to prevent Au diffusion, the distance between the mesa and the first anti-diffusion layer 36b may be 200 nm or less.

When a thickness of the first anti-diffusion layer 36b is 1 nm or more, the first anti-diffusion layer 36b may exhibit an Au anti-diffusion property. In order to suppress electrical and optical effects, the thickness of the first anti-diffusion layer 36b may be 5 nm or less.

In some implementations, the second anti-diffusion layer 43 may be included. The second anti-diffusion layer 43 may be arranged between the modulator electrode 40 and the second semi-insulating InP layer 36c to prevent Au from diffusing into the second semi-insulating InP layer 36c. The second anti-diffusion layer 43 may be undoped InGaAs, but other implementations are contemplated. Further, the second anti-diffusion layer 43 may have a different composition from that of the first anti-diffusion layer 36b. As described above, the second anti-diffusion layer 43 on the inclined surface portions of the BH layer 36 may be thin or may not be formed entirely. However, in some implementations, the first anti-diffusion layer 36b may be provided, and hence Au that may be left untrapped by the second anti-diffusion layer 43 may be prevented from diffusing into the modulator-section multiple-quantum well layer 39. Providing two anti-diffusion layers may prevent Au diffusion, but, in some implementations, an anti-diffusion property can be obtained by using the first anti-diffusion layer 36b, and hence the second anti-diffusion layer 43 may be omitted.

Figure 4A:
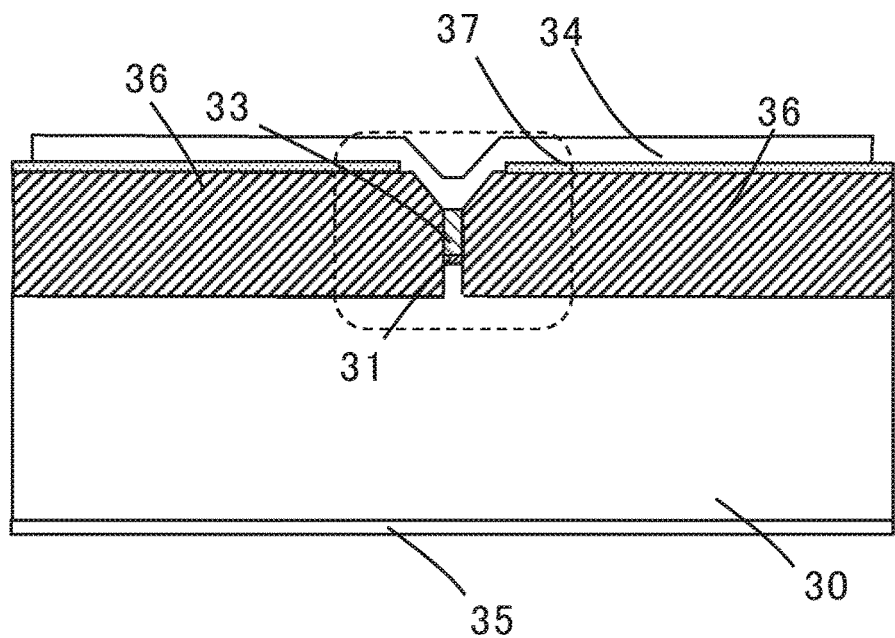
FIG. 4A is a cross-sectional view taken along the line C-C of the optical semiconductor device illustrated in FIG. 1.

FIG. 4A is a schematic view of a cross section taken along the line C-C, which may be perpendicular to an optical axis of the semiconductor laser 10 illustrated in FIG. 1. The mesa structure may be formed of the portion of the n-InP substrate 30, the laser-section multiple-quantum well layer 31, the p-InP cladding layer 33, and the contact layer 42. The p-InP cladding layer 33 may include the grating layer 32 (see FIG. 4B). Both sides of the mesa structure may be buried in the BH layer 36. The laser-section electrode 34 may be arranged widely over the BH layer 36 on both sides of the mesa structure and an upper surface of the mesa structure. The laser-section electrode 34 may have a three-layer structure of Ti, Pt, and Au from the BH layer 36 side. Further, above the BH layer 36, the insulating film 37 may be arranged between the laser-section electrode 34 and the BH layer 36.

Figure 4B:
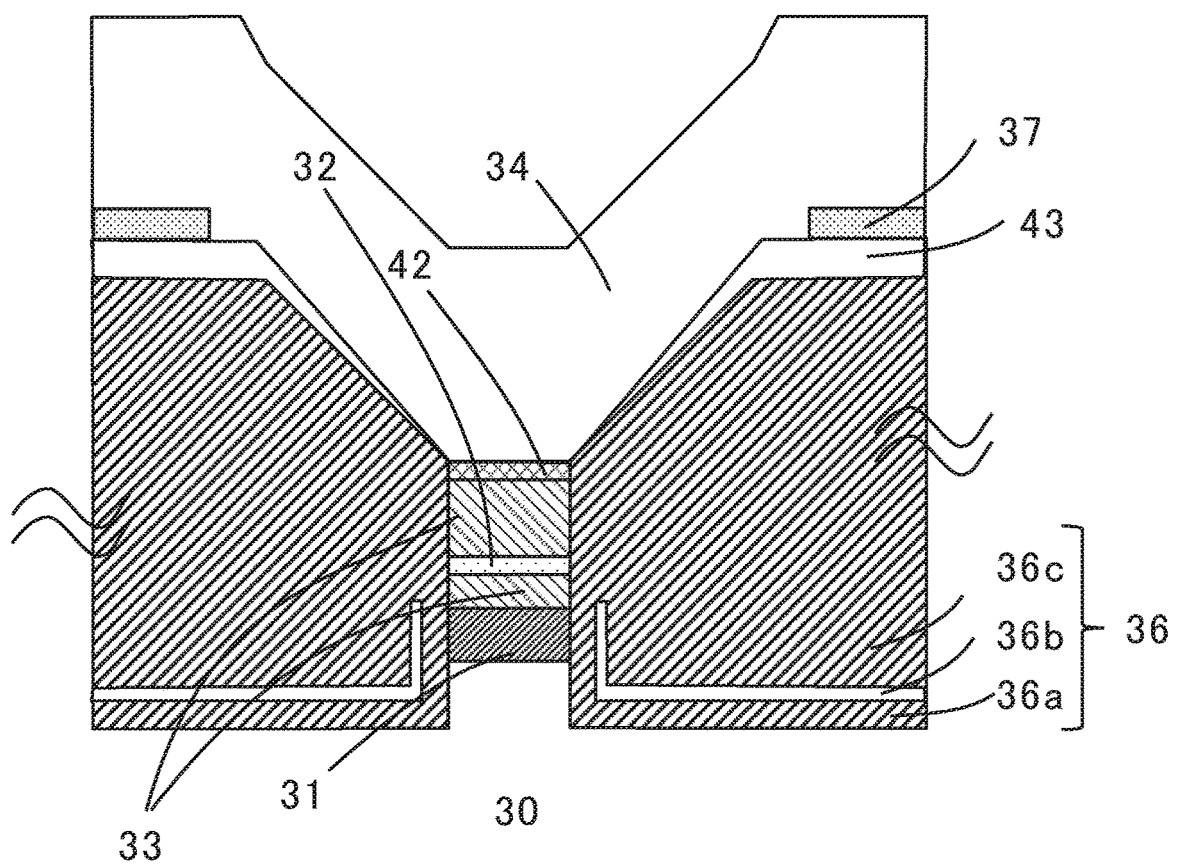
FIG. 4B is a partially enlarged view of FIG. 4A.

FIG. 4B is an enlarged view of a region delineated by the dotted rectangle of FIG. 4A. The BH layer 36 may have a configuration similar to that provided in the EA modulator 11. In other words, the BH layer 36 may have a three-layer configuration of the first semi-insulating InP layer 36a, the first anti-diffusion layer 36b, and the second semi-insulating InP layer 36c. Arrangement positions and compositions thereof and the like are similar to those described with reference to FIG. 3B. Therefore, also in the semiconductor laser 10, as in the EA modulator 11, Au may be prevented from diffusing into the laser-section multiple-quantum well layer 31, and a semiconductor device having excellent reliability may be provided.

The semiconductor device 1 may be manufactured using one or more methods described herein. In some implementations, before forming the BH layer 36, a process may be performed through the use of multilayer growth technology, BJ technology, and photolithography technology. Accordingly, the semiconductor laser 10, the waveguide 12, the EA modulator 11 may be formed as mesa structures (high mesas) that are connected to each other, but nothing may be formed on the side surfaces of the mesa structures. On top of each of the mesa structure, an oxide film mask may be formed. Next, the first semi-insulating InP layer 36a, to which Fe may be added, may be crystal-grown by an MOCVD method. At this time, the first semi-insulating InP layer 36a may be crystal-grown to cover the entirety of the side surfaces of each of the mesa structure sand the horizontal region (surface of the n-InP substrate 30) on the sides of the mesa structures. The first semi-insulating InP layer 36a may be crystal-grown until the first semi-insulating InP layer 36a covers the contact layer 42 at the top of the mesa structure. After stacking the first semi-insulating InP layer 36a on the side surfaces of the mesa structure in a lateral direction in the drawing (e.g., to a thickness of 10 nm), the first anti-diffusion layer 36b may be grown. At this time, when switching from the first semi-insulating InP layer 36a to the first anti-diffusion layer 36b, a wafer may not be taken out of a furnace body of a crystal apparatus, and the first semi-insulating InP layer 36a and the first anti-diffusion layer 36b may be continuously grown in multiple layers. This applies also to crystal growth of the second semi-insulating InP layer 36c and the second anti-diffusion layer 43, which is described herein. The first anti-diffusion layer 36b may be grown to cover a surface of the first semi-insulating InP layer 36a. In some implementations, the first anti-diffusion layer 36b may formed substantially in parallel to the side surfaces of the mesa structure and may not reach the top of the mesa structure, but may be grown up to a midway point of the p-InP cladding layer 33 in a height direction. After stacking the first anti-diffusion layer 36b (e.g., by 2 nm) toward a direction away from the side surfaces of the mesa structure, the second semi-insulating InP layer 36c may be grown. After the second semi-insulating InP layer 36c exceeds a height of the mesa structure, the second semi-insulating InP layer 36c may be grown, as illustrated in FIG. 3B, for example, in a shape including inclined surface portions that become higher as the second semi-insulating InP layer 36c becomes farther away from the mesa structure. After stacking the second semi-insulating InP layer 36c (e.g., by 6 μm), the second anti-diffusion layer 43 may be grown (e.g., by 100 nm in thickness in a horizontal region). In some implementations, a region in the second anti-diffusion layer 43 may be thin (e.g., thinner than 100 nm) and a region that may not be grown may be generated on the inclined surface portions. The mask on the mesa structure may be removed to complete the formation of the BH layer 36 and the second anti-diffusion layer 43.

In some implementations, the BH layer 36 may be removed to reduce a parasitic capacitance of the EA modulator 11. The second anti-diffusion layer 43 and the BH layer 36 may be removed through the use of dry etching or wet etching with a mask. Accordingly, the second anti-diffusion layer 43 may also have an effect of preventing side etching from being increased. Further, the etching may be generally performed under time control to obtain a desired etching amount. However, the BH layer 36 may be a thick layer (e.g., of about 6 µm), and hence the etching amount may vary within the optical semiconductor device or within a wafer surface. However, because the first anti-diffusion layer 36b and the second semi-insulating InP layer 36c are made of different materials, the second semi-insulating InP layer 36c may be removed reliably until the first anti-diffusion layer 36b is reached by a selective etching technology, and the variation can be suppressed. A thickness from the first anti-diffusion layer 36b to the n-InP substrate 30 may not be thick, and hence the etching amount can be controlled satisfactorily through normal etching.

In some implementations, the insulating film 37 may be formed on the entire surface. Further, mesa tops of the semiconductor laser 10 and the EA modulator 11, and the insulating film 37 on the inclined surface portions of the BH layer 36 may be removed to form a through hole. Then, the laser-section electrode 34 and the modulator electrode 40, each of which may be made of Ti, Pt, and/or Au, may be formed. Subsequently, after polishing the n-InP substrate 30 to a particular thickness, the back-side electrode 35 may be formed on the back surface to complete the wafer. The wafer may be cut into bars, and the dielectric non-reflective film and the dielectric high-reflective film may be formed on the front end face 13 and the back end face 14, respectively. Finally, each device may be cut out of the bars to complete the semiconductor device 1 illustrated in FIG. 1.

Figure 5:
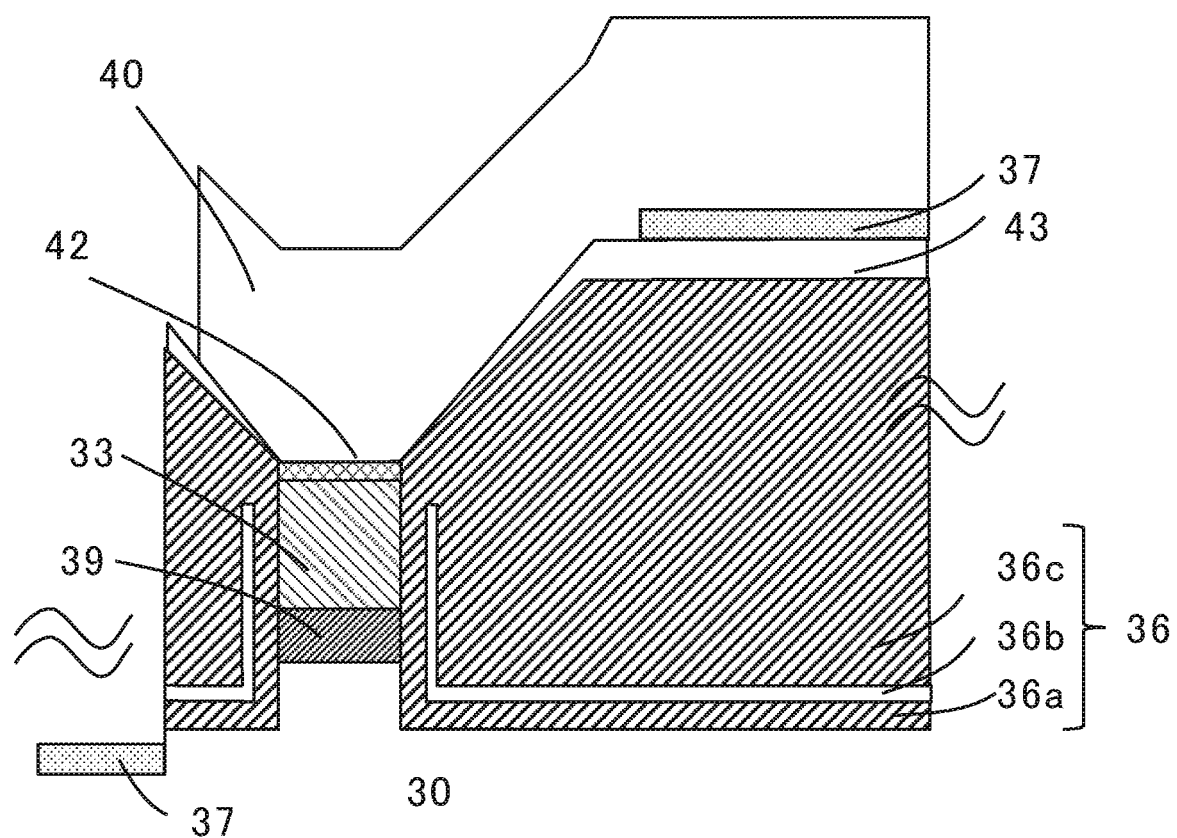
FIG. 5 is an enlarged view of a cross section taken along the line B-B of the optical semiconductor device illustrated in FIG. 1 in a first modification example.

FIG. 5 may be a cross-sectional view taken along the line B-B of the EA modulator 11 illustrated in FIG. 1 in a first modification example. As compared to FIG. 3B, tips of the first anti-diffusion layer 36b may extend higher. Some implementations have a goal of preventing diffusion of Au into the multiple-quantum well layer, and hence, in a lateral direction, as seen in FIG. 5, a first anti-diffusion layer 36b may overlap the side surface side of the multiple-quantum well layer. In order to further prevent the diffusion of Au into the multiple-quantum well layer, the tips of the first anti-diffusion layer 36b may extend up to at least 80% of the height of the mesa structure. Here, the height of the mesa structure may be a distance from the surface of the n-InP substrate 30 (bottom portion of the BH layer 36) to the top of the contact layer 42. In some implementations, the tips of the first anti-diffusion layer 36b may extend up to at least the height of the mesa structure.

Figure 6:
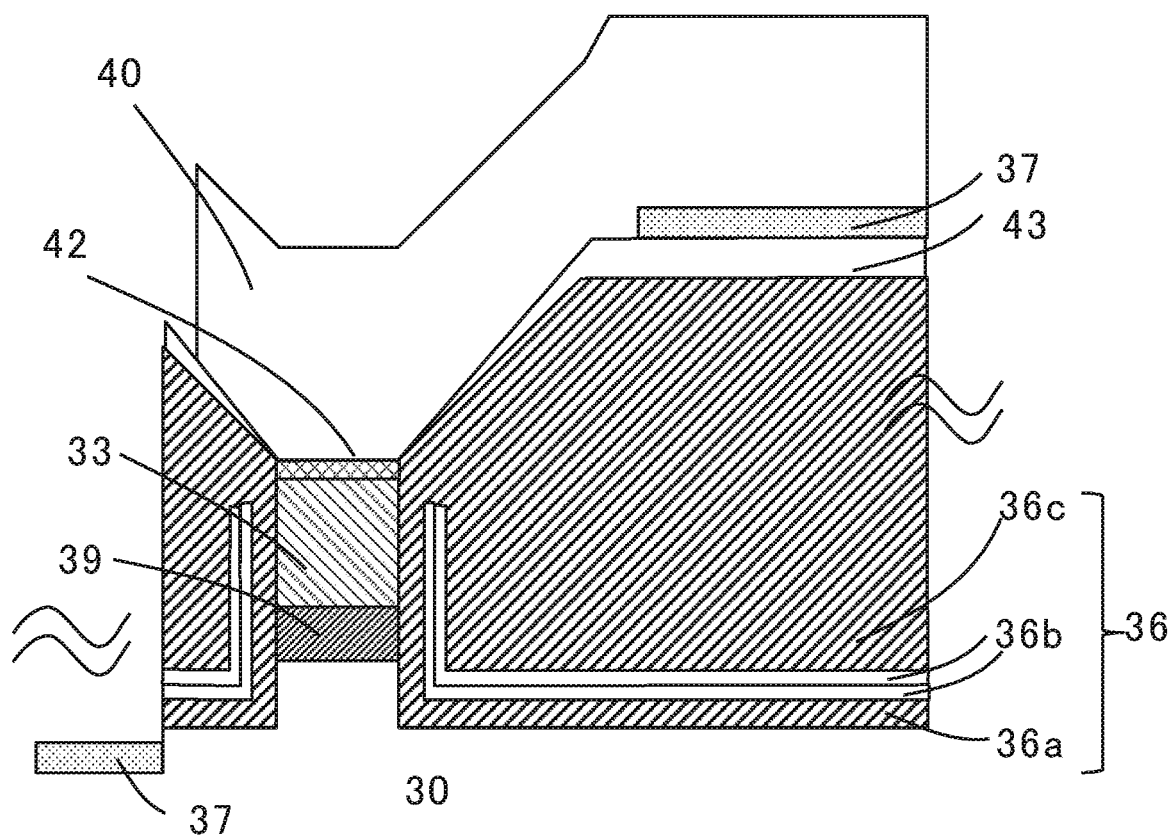
FIG. 6 is an enlarged view of a cross section taken along the line B-B of the optical semiconductor device illustrated in FIG. 1 in a second modification example.

FIG. 6 may be a cross-sectional view taken along the line B-B of the EA modulator 11 illustrated in FIG. 1 in a second modification example. As compared to FIG. 3B, the first anti-diffusion layer 36b may have a two-layer structure. Here, the first anti-diffusion layer 36b may be made of undoped InGaAs and undoped InGaAsP. Through combination of different semiconductor layers, the diffusion of Au may be further reduced. In some implementations, the first anti-diffusion layer 36b may be formed of a combination of a plurality of semiconductor layers that have smaller Au diffusion constants than that of InP. In some implementations, the second anti-diffusion layer 43 may be configured in a similar manner. Further, a similar structure may be adopted in the semiconductor laser 10.

Figure 7:
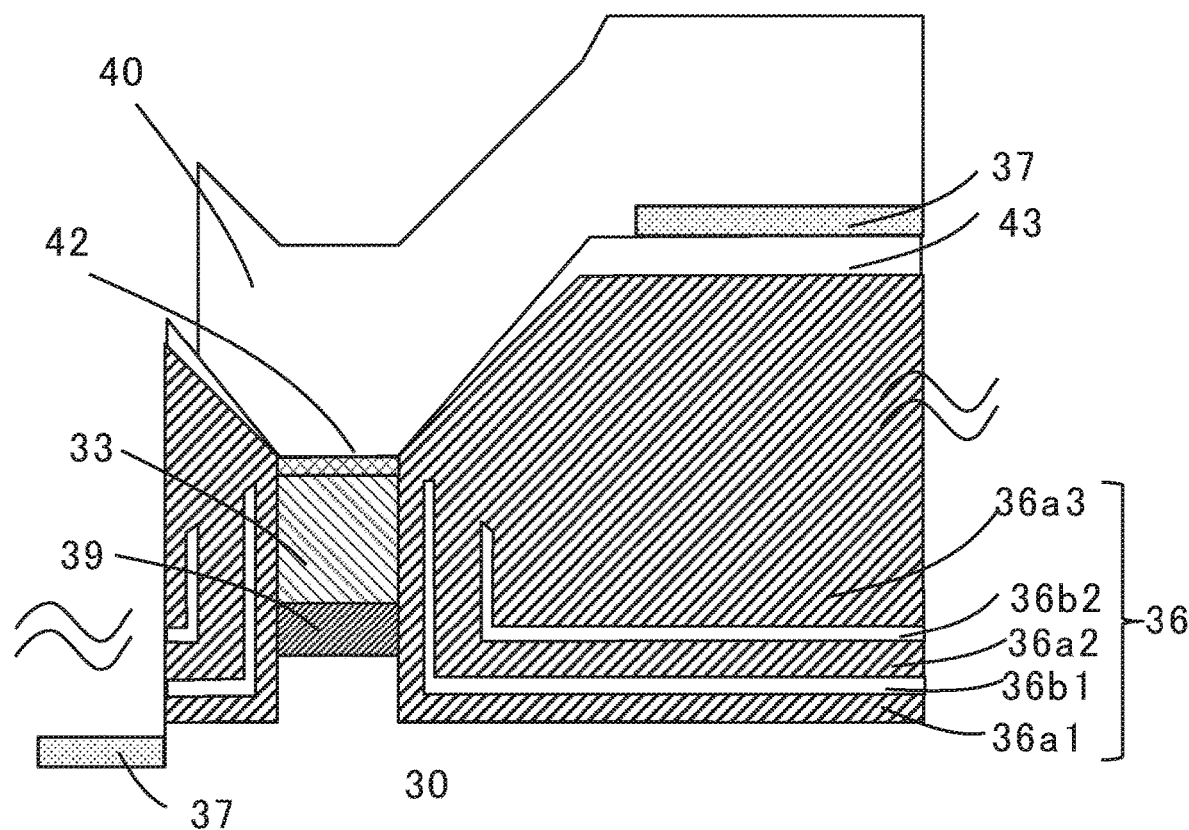
FIG. 7 is an enlarged view of a cross section taken along the line B-B of the optical semiconductor device illustrated in FIG. 1 in a third modification example.

FIG. 7 is a cross-sectional view taken along the line B-B of the EA modulator 11 illustrated in FIG. 1 in a third modification example. As compared to FIG. 3B, the BH layer 36 may have a five-layer configuration of a first semi-insulating InP layer 36a1, a first anti-diffusion layer 36b1, a second semi-insulating InP layer 36a2, a third anti-diffusion layer 36b2, and a third semi-insulating InP layer 36a3 (e.g., from the n-InP substrate 30 side). In other words, two anti-diffusion layers for Au may be included in the BH layer 36. As the semi-insulating InP layer, any insulating InP layer described above may be selected, and the same applies to the two anti-diffusion layers. Further, the third anti-diffusion layer 36b2 may not cover up to at least 80% of the height of the mesa structure. In some implementations, to provide an anti-diffusion property, it may be sufficient that the anti-diffusion layer closest to the mesa structure (in this example, the first anti-diffusion layer 36b1) cover the side surface side of the modulator-section multiple-quantum well layer 39. Two or more anti-diffusion layers may be interposed in the BH layer, but a smaller number of anti-diffusion layers may be used to ensure crystal quality of the whole BH layer, for example. Further, a similar structure may be adopted in the semiconductor laser 10.

Figure 8:
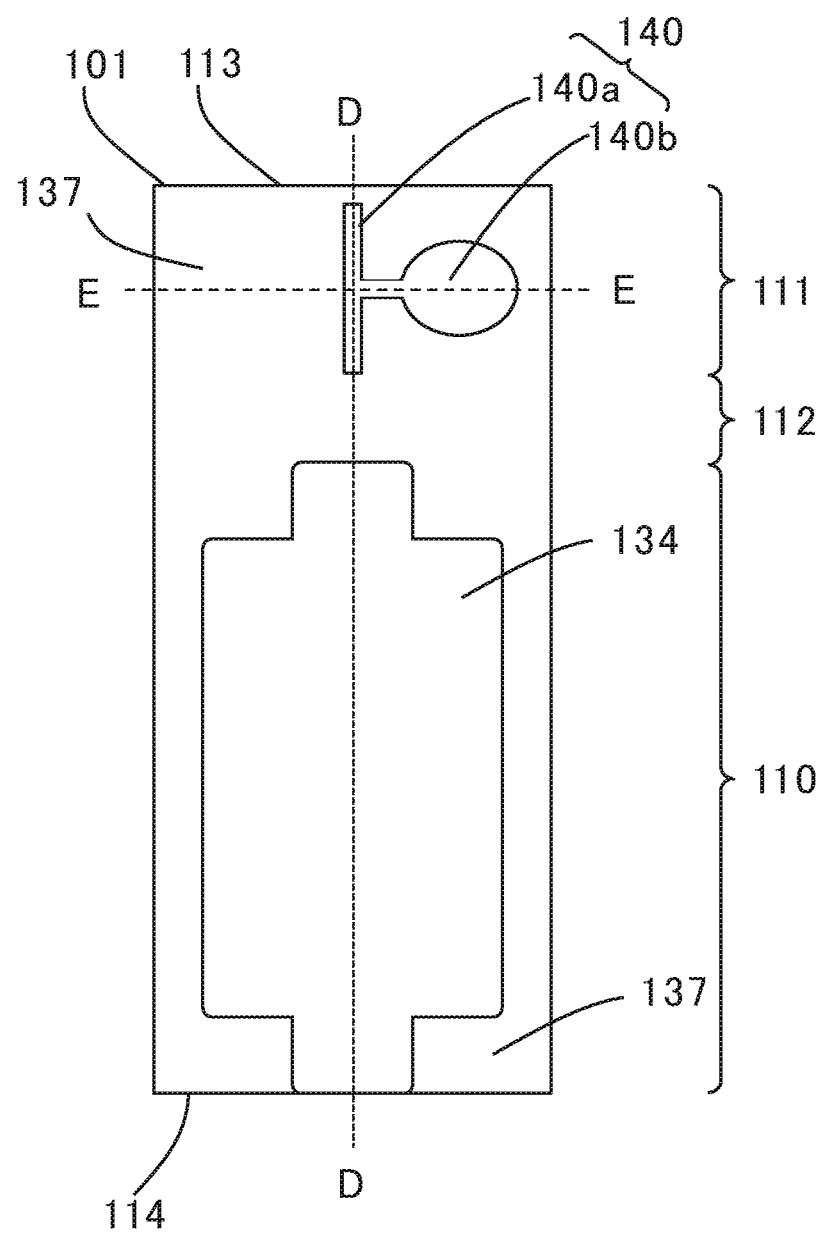
FIG. 8 is a top view of another example optical semiconductor device described herein.

FIG. 8 is a top view of another example optical semiconductor device 101. The optical semiconductor device 101 may be a modulator-integrated semiconductor laser in which a semiconductor laser 110 and an electro-absorption modulator (EA modulator) 111 are integrated. While an integrated example is described herein, implementations include just the semiconductor laser or just the EA modulator. The optical semiconductor device 101 may be an integrated device in which the semiconductor laser 110, a waveguide 112, and the EA modulator 111 are optically connected to one another (e.g., in the stated order). The semiconductor laser 110 may be configured to emit continuous light, and the waveguide 112 may be configured to transmit the emitted light from the semiconductor laser 110 to the EA modulator 111. The EA modulator 111 may include a multiple-quantum well layer that absorbs light corresponding to an oscillation wavelength of the semiconductor laser 110. The continuous light that has passed through the waveguide 112 and has entered the EA modulator 111 may be modulated in intensity by the EA modulator 111 to be converted into a modulated optical signal that may be binary or 4-level, for example. The modulated optical signal may output from the EA modulator 111 from a front end face 113. Another structure, for example, a window structure in which insulating InP may be arranged, may be provided near the front end face. On the front end face 113, a dielectric non-reflective film (not shown) may be formed. Further, on a back end face 114, which may be an end face on an opposite side of the optical semiconductor device 101, a dielectric high-reflective film (not shown) may be formed. Further, although details are described later, a mesa structure may be provided from the semiconductor laser 110 to the EA modulator 111, and two sides of the mesa structure may be buried in a semiconductor burial layer to form a buried semiconductor device. A PBH structure in which a cladding layer may be formed on an upper surface of the burial layer may be further provided.

Figure 9:
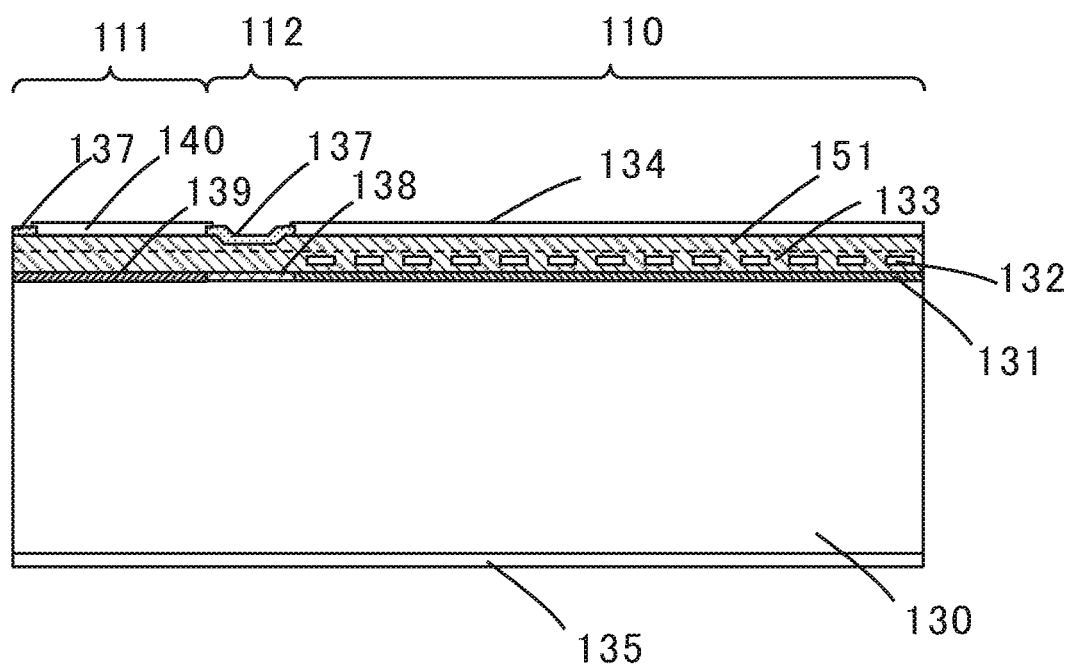
FIG. 9 is a cross-sectional view taken along the line D-D of the optical semiconductor device illustrated in FIG. 8.

FIG. 9 is a schematic view of a cross section taken along the line D-D, which may be parallel to an optical axis of the optical semiconductor device 101. On an n-InP substrate 130 (substrate) serving as a base, the semiconductor laser 110, the waveguide 112, and the EA modulator 111 may be integrated. Here, the n-InP substrate 130 serves also as a first conductivity type semiconductor layer. The semiconductor laser 110 may be, for example, a DFB laser configured to oscillate in a 1.3-μm band, the 1.55-μm band, or another band. Further, the semiconductor laser 110 may be an FP laser, a DBR laser, or a DR laser, among other examples. The semiconductor laser 110 may include a laser-section multiple-quantum well layer 131, and a grating layer 132 provided above the laser-section multiple-quantum well layer 131. Between and on gratings of the grating layer 132, a first p-InP cladding layer 133 (e.g., a second conductivity type semiconductor layer) may be provided. Although not shown, optical confinement layers may be provided on and below the laser-section multiple-quantum well layer 131, respectively. A second p-InP cladding layer 151 (e.g., a third semiconductor layer) may be further provided on the first p-InP cladding layer 133. In FIG. 9, for convenience of description, a dotted line may be depicted at a boundary between the first p-InP cladding layer 133 and the second p-InP cladding layer 151. In some implementations, the first p-InP cladding layer 133 and the second p-InP cladding layer 151 may form an integrated p-InP cladding layer after manufacture, which may cause the boundary to be unclear. On an upper surface of the second p-InP cladding layer 151, a contact layer 152 (see FIG. 10B) may be provided. The contact layer 152 may be electrically and physically connected to a laser-section electrode 134 (e.g., a second conductivity-side electrode). On a back side of the n-InP substrate 130, a back-side electrode 135 (e.g., a first conductivity-side electrode) may be provided to cover substantially the entire surface of the n-InP substrate 130. The semiconductor laser 110 may be configured to emit the continuous light when an electric field is applied (electric current is input) between the laser-section electrode 134 and the back-side electrode 135. Here, a composition wavelength and the like of the laser-section multiple-quantum well layer 131, and a grating constant of the grating layer 132 may be set to oscillate in the 1.3-μm band.

The EA modulator 111 may include a modulator-section multiple-quantum well layer 139. Although not shown, optical confinement layers may be provided on and below the modulator-section multiple-quantum well layer 139, respectively. The modulator-section multiple-quantum well layer 139 may have a structure for absorbing light emitted from the semiconductor laser 110 when an electric field is applied to the modulator-section multiple-quantum well layer 139. Above the modulator-section multiple-quantum well layer 139, a first p-InP cladding layer 133 may be arranged. Here, the same first p-InP cladding layer 133 as that provided in the semiconductor laser 110 may be formed, or a different first p-InP cladding layer 133 may be formed. Above the first p-InP cladding layer 133, a second p-InP cladding layer 151 may be provided, and a contact layer 152 (not shown) may be provided on an upper surface of the second p-InP cladding layer 151. The second p-InP cladding layer 151 and the contact layer 152 may be the same as those provided in the semiconductor laser 110, or may be different layers. On the contact layer 152, a modulator electrode 140 (e.g., a second conductivity-side electrode) may be arranged. The modulator electrode 140 may include a region that is electrically and physically connected to the contact layer 152. Light may be absorbed when a reverse bias is applied between the modulator electrode 140 and the back-side electrode 135. The modulator electrode 140 may be formed of a substantially rectangular modulator mesa electrode 140a provided above the mesa structure, and an elliptical modulator pad electrode 140b. The modulator mesa electrode 140a and the modulator pad electrode 140b may be connected to each other through a thin extraction electrode.

Further, the modulator electrode 140 may be divided into a plurality of parts for convenience of description, but the parts may be integral with a same structure. Further, the shape of the modulator pad electrode 140b may not be limited to the elliptical shape, but may be a rectangular shape, a rounded rectangular shape, or a circular shape. A signal wire (not shown) for transmitting an electrical signal to the EA modulator 1 may be connected to the modulator pad electrode 140b.

The waveguide 112 may include a waveguide-section semiconductor layer 138. The waveguide-section semiconductor layer 138 may be a semiconductor layer that does not absorb the light emitted from the semiconductor laser 110, and may be a bulk layer, for example. Further, optical confinement layers may be provided on and below the waveguide-section semiconductor layer 138, respectively. Above the waveguide-section semiconductor layer 138, a first p-InP cladding layer 133 may be arranged. On the first p-InP cladding layer 133, a second p-InP cladding layer 151 may be provided. Here, the same first p-InP cladding layer 133 and the second p-InP cladding layer 151 as those provided in the semiconductor laser 110 are formed, or different layers may be formed. The second p-InP cladding layer 151 of the waveguide 112 may have the same configuration as that provided in the semiconductor laser 110, but may have a different thickness. The second p-InP cladding layer 151 of the waveguide 112 may be thinner as compared to the second p-InP cladding layer 151 of the semiconductor laser 110. This increases electrical isolation between the EA modulator 111 and the semiconductor laser 110.

Figure 10A:
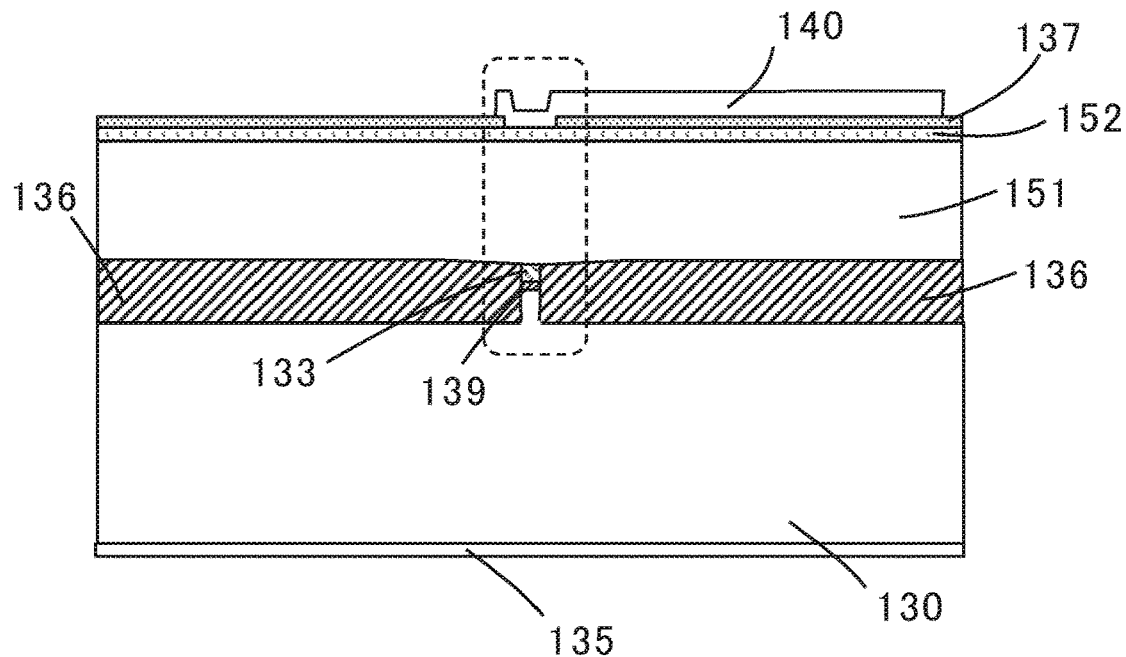
FIG. 10A is a cross-sectional view taken along the line E-E of the optical semiconductor device illustrated in FIG. 8.

FIG. 10A is a schematic view of a cross section taken along the line E-E, which may be perpendicular to an optical axis of the EA modulator 111. The EA modulator 111 may be mainly formed of two parts: the mesa structure, and the second p-InP cladding layer 151 and subsequent layers on the mesa structure. The mesa structure may be formed of a portion of the n-InP substrate 130, the modulator-section multiple-quantum well layer 139, and the first p-InP cladding layer 133. Two sides of the mesa structure are buried in a burial layer (BH layer) 136. On the BH layer 136, the second p-InP cladding layer 151 may be formed over the mesa structure and the entire upper surface of the BH layer on both sides of the mesa structure. On an upper surface of the second p-InP cladding layer 151, a contact layer 152 made of p-type InGaAs may be provided. On the contact layer 152, an insulating film 137 made of $SiO_2$ may be provided except above the mesa structure. On an upper surface of the insulating film 137 and an upper surface of the contact layer 152, the modulator electrode 140 may be provided.

Figure 10B:
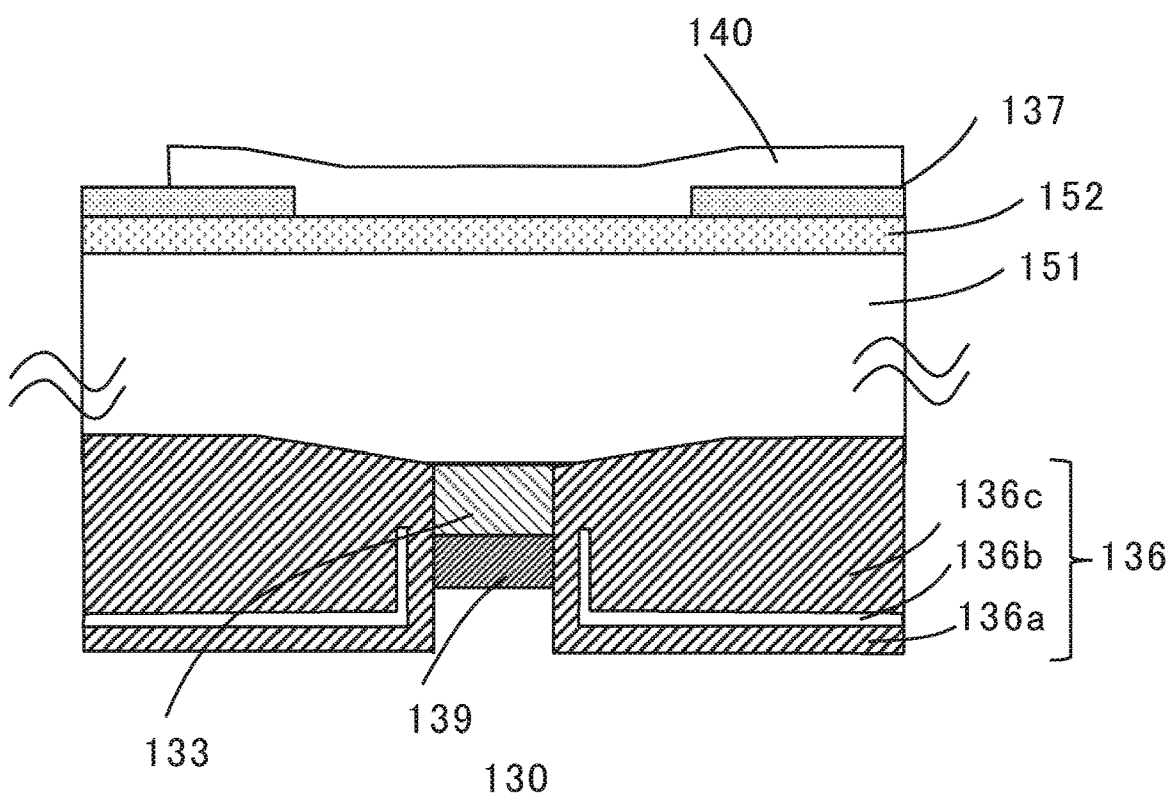
FIG. 10B is a partially enlarged view of FIG. 10A.

FIG. 10B may be an enlarged view of a region delineated by the dotted rectangle of FIG. 10A. Although not shown in FIG. 10A, the BH layer 136 of the semiconductor device 101 may have a three-layer configuration of a first semi-insulating InP layer 136a, a first anti-diffusion layer 136b, and a second semi-insulating InP layer 136c. The second semi-insulating InP layer 136c may be a layer that is thicker than the first semi-insulating InP layer 136a. Details of the BH layer 136 may be the same or similar as those of the BH layer 36 described above. In some implementations, the BH layer 136 may have or may not have inclined surface portions.

Benefits of the optical semiconductor device 101 may be the same as or similar to benefits of the optical semiconductor device 1. For example, when the first anti-diffusion layer 136b is arranged on side portions of the modulator-section multiple-quantum well layer 139, diffusion of Au may be reduced. As another example, the contact layer 152 may serve as a second anti-diffusion layer. Accordingly, the effect of Au diffusion can be reduced in the semiconductor laser 110.

Figure 11:
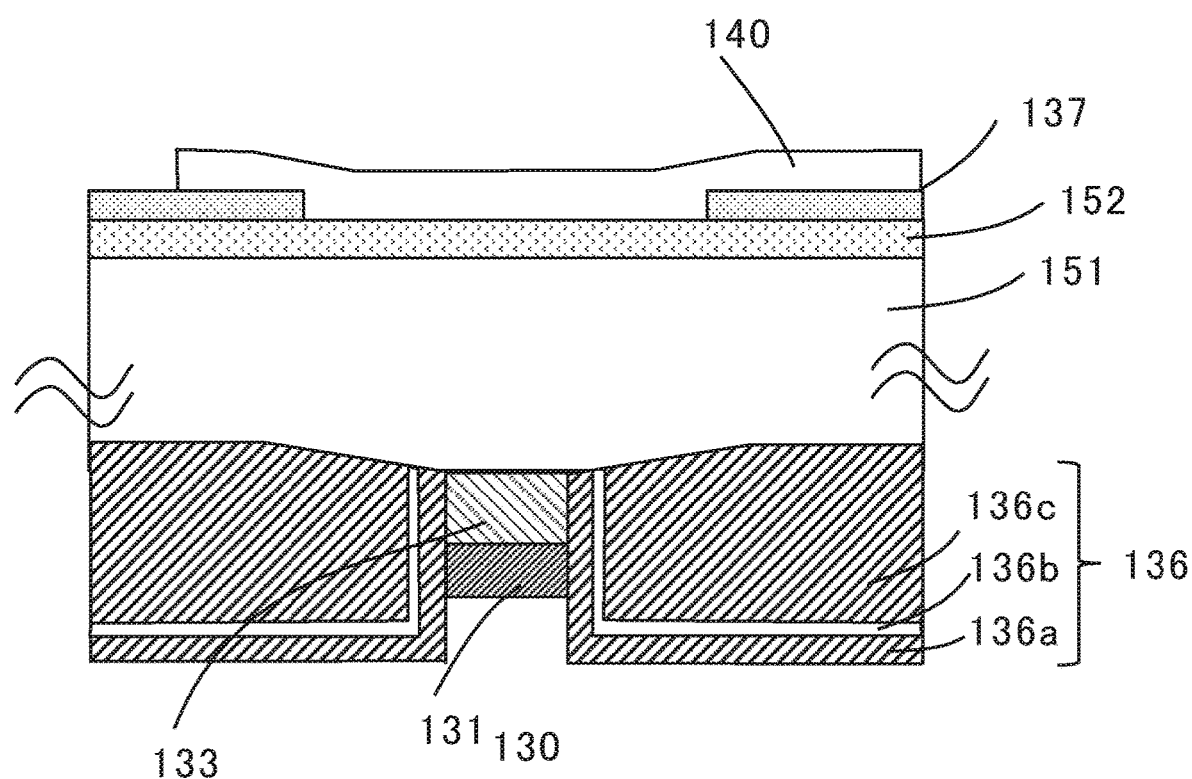
FIG. 11 is an enlarged view of a cross section taken along the line E-E of the optical semiconductor device illustrated in FIG. 8 in a first modification example.

FIG. 11 may be a cross-sectional view taken along the line E-E of the EA modulator 111 illustrated in FIG. 8 in a first modification example. As compared to FIG. 10B, tips of the first anti-diffusion layer 136b may extend up to a region that may be in contact with the second p-InP cladding layer 151. With this configuration, Au that has diffused into the second semi-insulating InP layer 136c is significantly prevented from reaching the modulator-section multiple-quantum well layer 139. It may be preferred that, as in the structure described in relation to FIG. 5, the tips of the first anti-diffusion layer 136b may extend up at least 80% of the mesa height or more.

It is to be understood that various modification examples described herein may be applied to any implementation described herein.

In the implementations described above, the substrate has been described to be an n-InP substrate. However, in some implementations, the substrate may be a p-InP substrate and a structure opposite in polarity to that described above may be adopted. Further, a semi-insulating substrate may be adopted. In the case of the semi-insulating substrate, an n-type semiconductor layer (first conductivity type semiconductor layer) may be arranged on the semi-insulating substrate.

The foregoing disclosure provides illustration and description, but is not intended to be exhaustive or to limit the implementations to the precise forms disclosed. Modifications and variations may be made in light of the above disclosure or may be acquired from practice of the implementations. Furthermore, any of the implementations described herein may be combined unless the foregoing disclosure expressly provides a reason that one or more implementations may not be combined.

Even though particular combinations of features are recited in the claims and/or disclosed in the specification, these combinations are not intended to limit the disclosure of various implementations. In fact, many of these features may be combined in ways not specifically recited in the claims and/or disclosed in the specification. Although each dependent claim listed below may directly depend on only one claim, the disclosure of various implementations includes each dependent claim in combination with every other claim in the claim set. As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiple of the same item.

No element, act, or instruction used herein should be construed as critical or essential unless explicitly described as such. Also, as used herein, the articles "a" and "an" are intended to include one or more items, and may be used interchangeably with "one or more." Further, as used herein, the article "the" is intended to include one or more items referenced in connection with the article "the" and may be used interchangeably with "the one or more." Furthermore, as used herein, the term "set" is intended to include one or more items (e.g., related items, unrelated items, or a combination of related and unrelated items), and may be used interchangeably with "one or more." Where only one item is intended, the phrase "only one" or similar language is used. Also, as used herein, the terms "has," "have," "having," or the like are intended to be open-ended terms. Further, the phrase "based on" is intended to mean "based, at least in part, on" unless explicitly stated otherwise. Also, as used herein, the term "or" is intended to be inclusive when used in a series and may be used interchangeably with "and/or," unless explicitly stated otherwise (e.g., if used in combination with "either" or "only one of"). Further, spatially relative terms, such as "below," "lower," "above," "upper," and the like, may be used herein for ease of description to describe one element or feature's relationship to another element(s) or feature(s) as illustrated in the figures. The spatially relative terms are intended to encompass different orientations of the apparatus, device, and/or element in use or operation in addition to the orientation depicted in the figures. The apparatus may be otherwise oriented (rotated 90 degrees or at other orientations) and the spatially relative descriptors used herein may likewise be interpreted accordingly.

What is claimed is:

1. An optical semiconductor device, comprising:
   a substrate;
   a mesa structure provided on the substrate;
   a semiconductor burial layer provided in contact with two sides of the mesa structure; and
   an electrode containing Au, which is provided above the semiconductor burial layer, wherein:
   the mesa structure includes a first conductivity type semiconductor layer, a multiple-quantum well layer, and a second conductivity type semiconductor layer, which are stacked in the stated order from a substrate side,
   the semiconductor burial layer includes a first InP layer provided in contact with side portions of the mesa structure, a first anti-diffusion layer provided in contact with the first InP layer, and a second InP layer provided on the first anti-diffusion layer,
   the first anti-diffusion layer has an Au diffusion constant that is smaller than an Au diffusion constant of the first InP layer,
   the first anti-diffusion layer has a thickness that is less than or equal to 5 nanometers,
   the first anti-diffusion layer includes a region that extends in a direction away from the substrate, and
   the first anti-diffusion layer having a maximum height, relative to a surface of the substrate, that is less than a maximum height of the mesa structure, relative to the surface of the substrate.

2. The optical semiconductor device of claim 1, wherein:
   the mesa structure further includes a contact layer above the second conductivity type semiconductor layer;
   the second InP layer includes inclined surface portions that become higher in height from the surface of the substrate when moving farther away from the mesa structure;
   the electrode is arranged to cover the contact layer and at least a part of the inclined surface portions; and
   the electrode is in contact with the contact layer.

3. The optical semiconductor device of claim 2, further comprising a second anti-diffusion layer on the second InP layer, wherein:
   the second anti-diffusion layer is arranged between a part of the electrode and the second InP layer; and
   the second anti-diffusion layer has an Au diffusion constant that is smaller than an Au diffusion constant of the second InP layer.

4. The optical semiconductor device of claim 1, further comprising:

a third semiconductor layer that has a conductivity type that is the same as a conductivity type of the second conductivity type semiconductor layer,
  wherein the third semiconductor layer straddles the mesa structure and the second InP layer; and
a contact layer between the third semiconductor layer and the electrode.

5. The optical semiconductor device of claim 1, wherein the maximum height of the first anti-diffusion layer is greater than a maximum height of the multiple-quantum well layer relative to the surface of the substrate.

6. The optical semiconductor device of claim 1, wherein the region of the first anti-diffusion layer extends in a direction parallel to side surfaces of the mesa structure.

7. The optical semiconductor device of claim 1, wherein each of two sides of the mesa structure is separated from the first anti-diffusion layer by a distance of 10 nm or more.

8. The optical semiconductor device of claim 1, wherein the first anti-diffusion layer is one of InGaAs, InGaAsP, InGaAlAs, and InAlAs.

9. The optical semiconductor device of claim 1, wherein the first anti-diffusion layer is one of an undoped layer, an n-type layer, or a p-type layer.

10. The optical semiconductor device of claim 1, wherein the region of the first anti-diffusion layer becomes longer in distance from a side surface of the mesa structure as the region of the first anti-diffusion layer becomes closer to the surface of the substrate.

\* \* \* \* \*